(12) United States Patent
Jiang et al.

(10) Patent No.: US 12,092,956 B2
(45) Date of Patent: Sep. 17, 2024

(54) NANOIMPRINT AND ETCH FABRICATION OF OPTICAL DEVICES

(71) Applicant: Applied Materials, Inc., Santa Clara, CA (US)

(72) Inventors: Jing Jiang, Santa Clara, CA (US); Chien-An Chen, San Jose, CA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 17/703,315

(22) Filed: Mar. 24, 2022

(65) Prior Publication Data

US 2022/0326611 A1 Oct. 13, 2022

Related U.S. Application Data

(60) Provisional application No. 63/174,374, filed on Apr. 13, 2021.

(51) Int. Cl.
*G03F 7/00* (2006.01)
*G03F 7/16* (2006.01)
*G03F 7/20* (2006.01)

(52) U.S. Cl.
CPC .......... *G03F 7/0005* (2013.01); *G03F 7/2043* (2013.01); *G03F 7/162* (2013.01)

(58) Field of Classification Search
CPC ...... G03F 7/0005; G03F 7/162; G03F 7/2043; G03F 7/0002
See application file for complete search history.

(56) References Cited

U.S. PATENT DOCUMENTS

| 8,597,873 B2* | 12/2013 | Kawamura ............. G03F 7/038 |
| | | 430/322 |
| 2006/0046484 A1 | 3/2006 | Abatchev et al. |
| 2007/0281219 A1 | 12/2007 | Sandhu |
| 2008/0105649 A1 | 5/2008 | Chandrachood et al. |
| 2010/0081278 A1 | 4/2010 | Hussain et al. |
| 2010/0104984 A1* | 4/2010 | Shiobara ............... B82Y 10/00 |
| | | 430/319 |

(Continued)

OTHER PUBLICATIONS

International Search Report and Written Opinion dated Jul. 4, 2022 for Application No. PCT/US2022/021641.

*Primary Examiner* — Deoram Persaud
(74) *Attorney, Agent, or Firm* — Patterson + Sheridan, LLP

(57) ABSTRACT

Methods of forming optical devices using nanoimprint lithography and etch processes are provided. In one embodiment, a method is provided that includes depositing a first resist layer on a substrate, the substrate having a hardmask disposed thereon, imprinting a first resist portion of the first resist layer with a first single-height stamp, etching the first resist portion of the first resist layer, etching a first hardmask portion of the hardmask corresponding to the first resist portion of the first resist layer, removing the first resist layer and depositing a second resist layer, imprinting a second resist portion of the second resist layer with a second single-height stamp, etching the second resist portion of the second resist layer, and etching a second hardmask portion of the hardmask corresponding to the second resist portion of the second resist layer.

14 Claims, 9 Drawing Sheets

(56) References Cited

U.S. PATENT DOCUMENTS

| | | | |
|---|---|---|---|
| 2010/0140220 A1* | 6/2010 | Cho | B82Y 40/00 |
| | | | 216/41 |
| 2010/0187658 A1 | 7/2010 | Wei | |
| 2010/0187714 A1* | 7/2010 | Kobiki | B82Y 40/00 |
| | | | 264/135 |
| 2018/0045953 A1* | 2/2018 | Fan | G02B 1/002 |
| 2020/0326621 A1* | 10/2020 | Godet | G03F 7/0035 |
| 2023/0266594 A1* | 8/2023 | Peroz | G03F 7/0002 |
| | | | 385/37 |

* cited by examiner

NANOIMPRINT AND ETCH FABRICATION OF OPTICAL DEVICES

CROSS-REFERENCE TO RELATED APPLICATIONS

This application claims benefit of U.S. provisional patent application Ser. No. 63/174,374, filed Apr. 13, 2021, which is herein incorporated by reference.

BACKGROUND

Field

Embodiments of the present disclosure generally relate to optical device fabrication. In particular, embodiments described herein relate to methods of forming optical devices using nanoimprint lithography and etch processes.

Description of the Related Art

Optical devices may be used to manipulate the propagation of light using structures of the optical device formed on a substrate. These structures alter light propagation by inducing localized phase discontinuities (i.e., abrupt changes of phase over a distance smaller than the wavelength of light). These structures may be composed of different types of materials, shapes, or configurations on the substrate and may operate based upon different physical principles. The pitch and critical dimensions of the structures determines a duty cycle of the structures.

Fabrication of optical devices may include nanoim print lithography operations. Nanoimprint lithography involves a master, or stamp, having a pattern. The pattern of the stamp determines the pattern that is imprinted into the resist material and later etched into a device layer or substrate. When features having different duty cycles are imprinted onto a single optical device substrate, a residual layer formed by the nanoimprint process may be uneven, leading to decreased overall uniformity.

Accordingly, what is needed in the art are methods of forming optical devices using nanoimprint lithography and etch processes.

SUMMARY

Methods of forming optical devices using nanoimprint lithography and etch processes are provided. In one embodiment, a method is provided that includes depositing a first resist layer on a substrate, the substrate having a hardmask disposed thereon, imprinting a first resist portion of the first resist layer with a first single-height stamp, etching the first resist portion of the first resist layer, etching a first hardmask portion of the hardmask corresponding to the first resist portion of the first resist layer, removing the first resist layer and depositing a second resist layer, imprinting a second resist portion of the second resist layer with a second single-height stamp, etching the second resist portion of the second resist layer, and etching a second hardmask portion of the hardmask corresponding to the second resist portion of the second resist layer.

In another embodiment, a method is provided that includes depositing a first resist layer on a substrate through a spin-on deposition process, the first resist layer having a first resist portion and a second resist portion, imprinting the first resist layer with a single-height stamp, disposing a blocking layer on the second resist portion of the first resist layer, etching the first resist portion of the first resist layer, disposing the blocking layer on the first resist portion of the first resist layer, removing the blocking layer, and etching the second resist portion of the first resist layer.

In another embodiment, a method is provided that includes depositing a first resist layer on a substrate through a spin-on deposition process, the substrate having a hardmask and a device material disposed thereon, imprinting a first resist portion of the first resist layer with a single-height stamp, etching the first resist portion of the first resist layer, etching a first hardmask portion of the hardmask corresponding to the first resist portion of the first resist layer, removing the first resist layer and depositing a second resist layer, imprinting a second resist portion of the second resist layer with the single-height stamp, etching the second resist portion of the second resist layer, and etching a second hardmask portion of the hardmask corresponding to the second resist portion of the second resist layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present subject matter generally relate to optical device fabrication. In particular, embodiments described herein relate to methods of forming optical devices using nanoimprint lithography and etch processes.

Figure 1A:
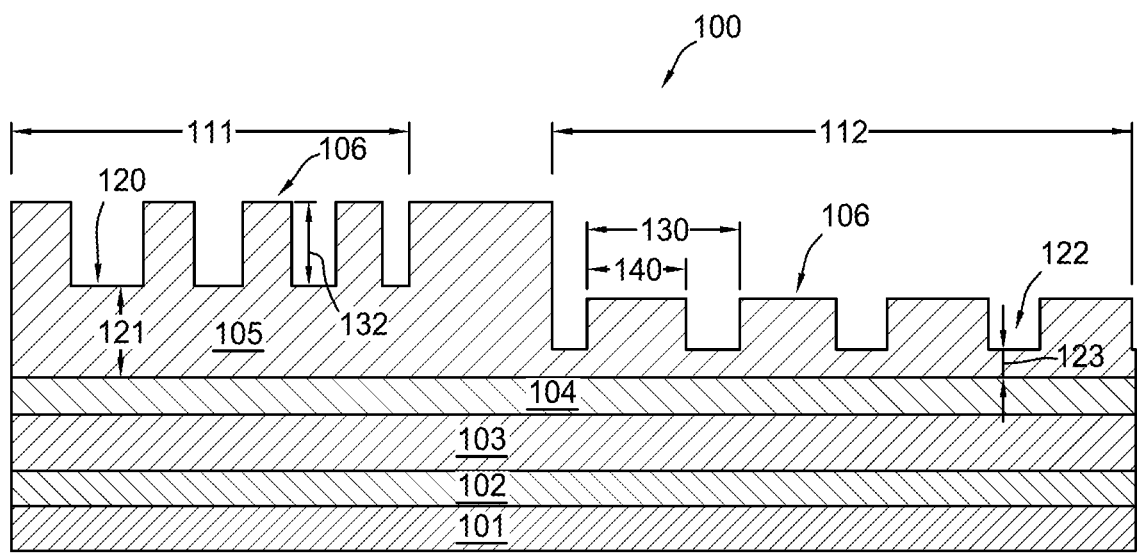
FIGS. 1A and 1B are schematic, cross-sectional views of a portion of an optical device substrate according to one or more embodiments.
Figure 1B:
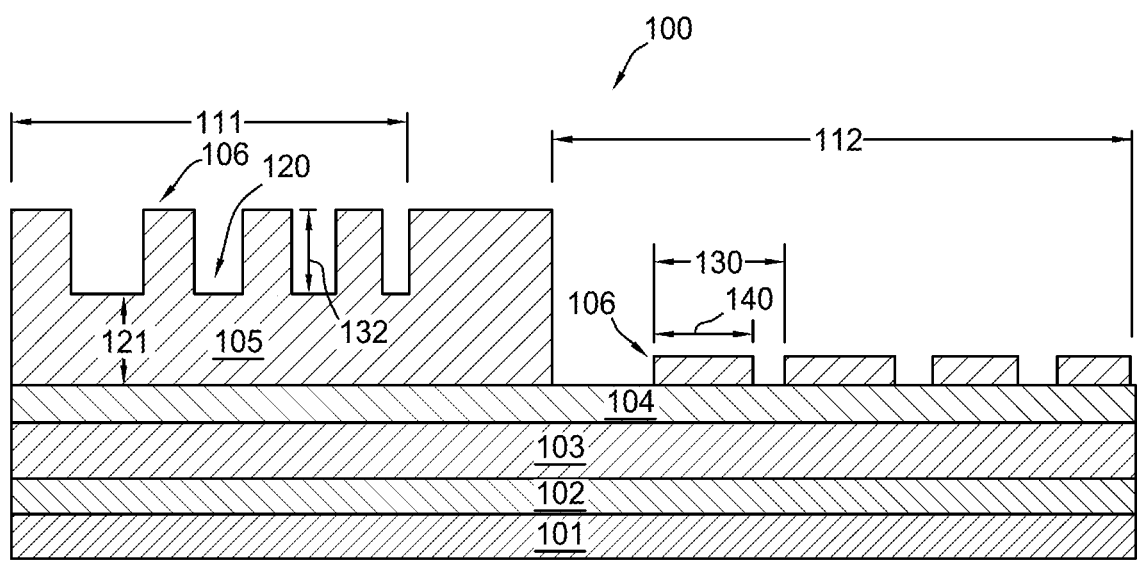

FIGS. 1A and 1B are schematic, cross-sectional views of a portion 100 of an optical device substrate 101 according to one or more embodiments. The optical device substrate 101 can be fabricated into an optical device. In one embodiment, which can be combined with other embodiments described herein, the optical device formed from the optical device substrate 101 is a waveguide combiner, such as an augmented waveguide combiner. In another embodiment, which can be combined with other embodiments described herein, the optical device formed from the optical device substrate 101 is a flat optical device, such as a metasurface. The optical device substrate 101 may be formed from any suitable material, provided that the optical device substrate 101 can adequately transmit light in a desired wavelength or wavelength range. Substrate selection may include substrates of any suitable material, including, but not limited to, amorphous dielectrics, non-amorphous dielectrics, crystalline dielectrics, silicon oxide, polymers, and combinations thereof. In some embodiments, which can be combined with other embodiments described herein, the optical device substrate 101 includes a transparent material. In one embodiment, which can be combined with other embodiments described herein, the optical device substrate 101 includes silicon (Si), silicon dioxide ($SiO_2$), silicon carbide (SiC), germanium (Ge), silicon germanium (SiGe), indium phosphide (InP), gallium arsenide (GaAs), gallium nitride (GaN), fused silica, quartz, or sapphire. In another embodiment, which can be combined with other embodiments described herein, the optical device substrate 101 includes high-index transparent materials such as high-refractive-index glass.

In one embodiment, which can be combined with other embodiments described herein, a device material 102 is disposed on the optical device substrate 101. The device material 102 may be used to form a plurality of optical device structures on the optical device substrate 101, as shown in FIGS. 3H and 5E. The device material 102 includes, but is not limited to, one or more of silicon oxycarbide (SiOC), titanium dioxide ($TiO_2$), silicon dioxide ($SiO_2$), vanadium (IV) oxide (VOx), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), or silicon carbon-nitride (SiCN) containing materials.

In one embodiment, which can be combined with other embodiments disclosed herein, a hardmask 103 is disposed on the device material 102 or the optical device substrate 101. The hardmask 103 is used to pattern the underlying material, i.e. the device material 102 or the optical device substrate 101. The hardmask 103 includes, but is not limited to, silicon nitride (SiN), silicon oxide (SiO), silicon oxycarbide (SiOC), tantalum oxide ($Ta_2O_5$), borophosphosilicate glass (BPSG), phosphosilicate glass (PSG), dielectrics, metals, or metallic alloys. In one embodiment, which can be combined with other embodiments described herein, the metal may be chromium (Cr). In another embodiment, which can be combined with other embodiments described herein, the metallic alloy may be titanium nitrate (TiN).

A first resist layer 105 disposed on the hardmask 103 is an imprintable material that may be patterned by a nanoimprint process to form a plurality of resist structures 106. In one embodiment, which can be combined with other embodiments, the first resist layer 105 is a nanoimprint resist. Each resist structure 106 has a pitch 130, a height 132, and a critical dimension 140. The pitch 130 is determined from distances between first edges of the resist structures 106. A first wetting layer 104 is optionally disposed between the hardmask 103 and the first resist layer 105. The first wetting layer 104 improves the adhesion of the first resist layer 105, particularly when the first resist layer 105 is deposited through a spin-on coating process.

Adjacent resist structures 106 of the plurality of resist structures 106 have a duty cycle. The duty cycle is determined by dividing the critical dimension 140 of the resist structure 106 by the pitch 130. The critical dimension 140 may be a width or a diameter of a resist structure 106. As depicted in FIG. 1A, different portions of the resist structures 106 may have different duty cycles depending on the conditions of the nanoim printing process or on the optical design. For example, a first resist portion 111 of the first resist layer 105 and resist structures 106 has a first duty cycle, and a second resist portion 112 of the first resist layer 105 and the resist structures 106 has a second duty cycle. In one embodiment, which can be combined with other embodiments described herein, the second duty cycle is greater than the first duty cycle. In another embodiment, which can be combined with other embodiments described herein, the first duty cycle is greater than the second duty cycle.

The value of the duty cycle results in variation between a thickness 121 of the first residual layer 120 and a thickness 123 of a second residual layer 122 formed in the first resist layer 105 through the nanoimprinting process. Generally, lower duty cycle features have a thicker residual layer, e.g., the first residual layer 120, and higher duty cycle features have a thinner residual layer, e.g., the second residual layer 122. When the patterned resist structures 106 are etched, the second resist portion 112 having a lower duty cycle may be over-etched before the first resist portion 111 is etched past the first residual layer 120. Over-etching, as depicted in FIG. 1B, may result in the loss of resolution in the resist structures 106 in the second resist portion 112. The resolution of the resist structures 106 affects the end result optical device formed on the optical device substrate 101.

Figure 2:
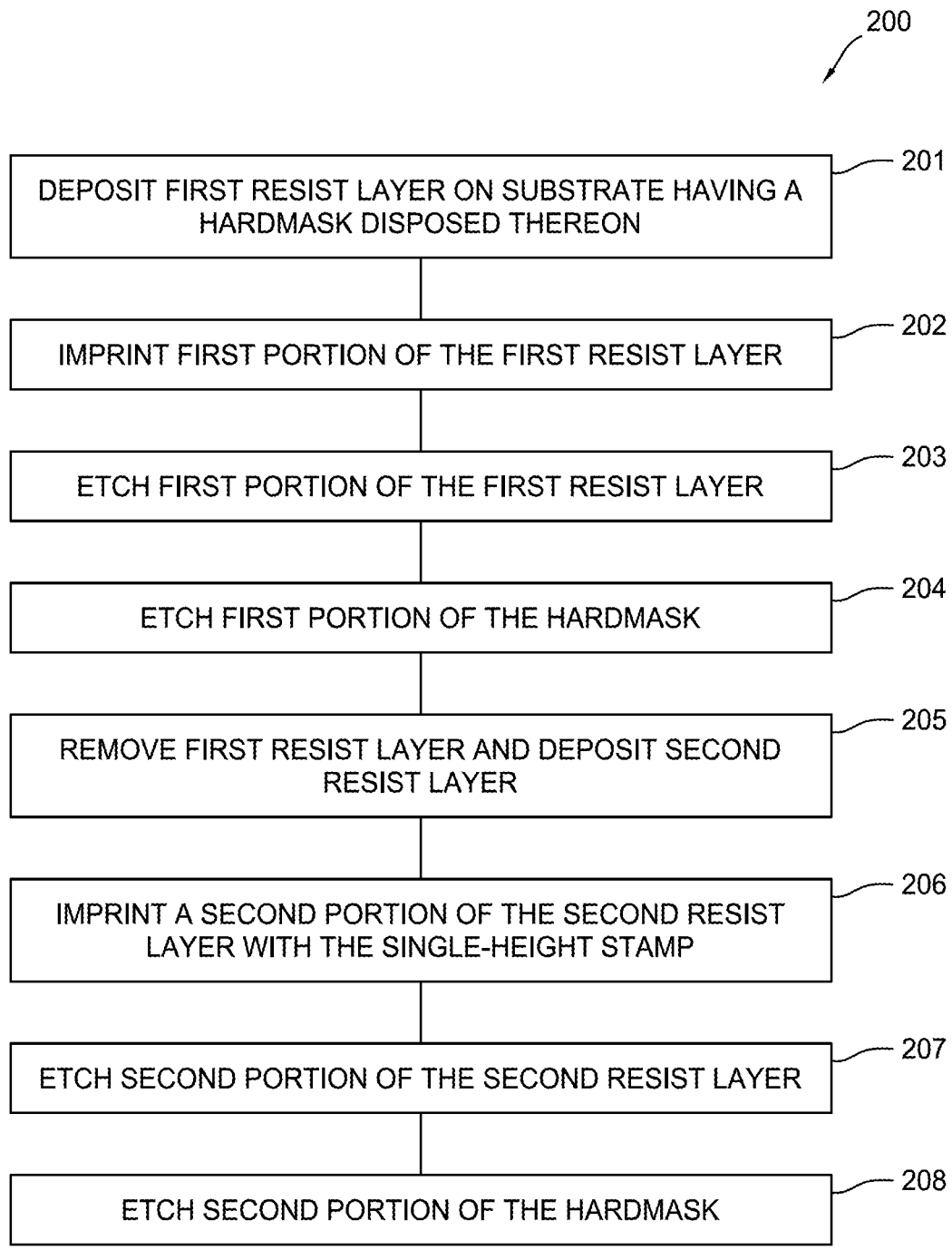
FIG. 2 is a method of patterning an optical device substrate according to one or more embodiments.

FIG. 2 is a method 200 of patterning an optical device substrate 101. FIGS. 3A-3H are schematic, cross-sectional views of a portion 100 of an optical device substrate 101.

The method 200 described herein forms a residual layer thickness such that the pattern formed in the resist layer is able to withstand the etch process. By withstanding the etch process, the optical device structures may be fabricated with improved uniformity and resolution. At operation 201, the first resist layer 105 is deposited on the optical device substrate 101 having a hardmask 103 disposed thereon. The first resist layer 105 is deposited by any suitable method, e.g., a spin-on deposition process, slot-die coating process, or ink jet material deposition process. In one embodiment, which can be combined with other embodiments described herein, a first wetting layer 104 is disposed on the hardmask 103 beneath the resist layer 105. In one embodiment, which can be combined with other embodiments described herein, the device material 102 is disposed on the optical device substrate 101 beneath the hardmask 103.

Figure 3A:
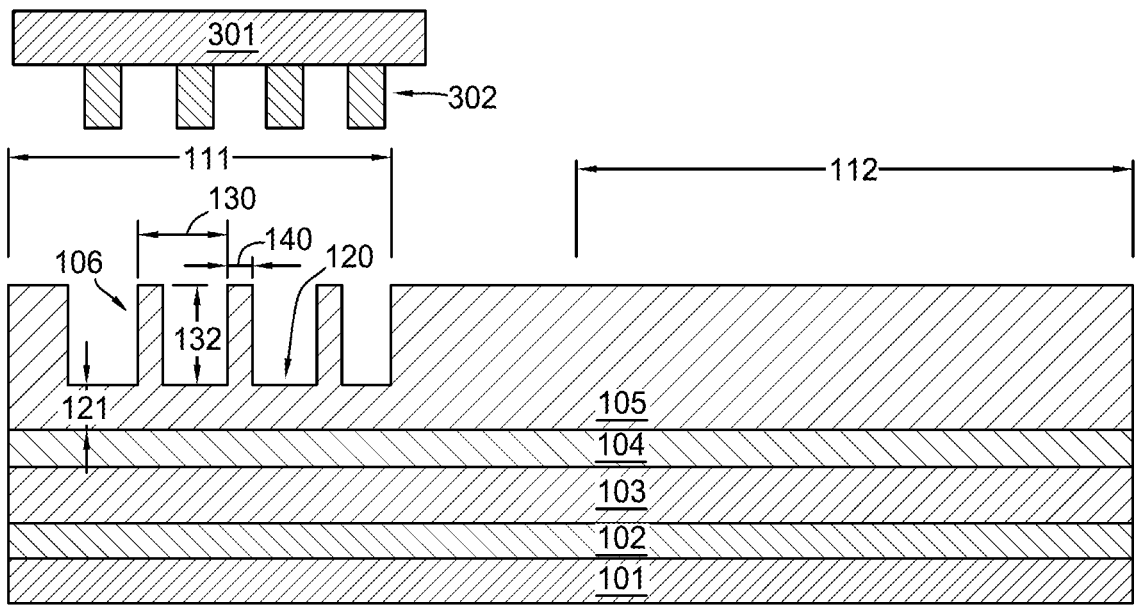
FIGS. 3A-3H are schematic, cross-sectional views of a portion of an optical device substrate according to one or more embodiments.

At operation 202, as shown in FIG. 3A, the first resist portion 111 of the first resist layer 105 is imprinted using a stamp 301. The stamp 301 is a single-height stamp, wherein a plurality of features 302 of the stamp 301 are substantially equal in height. By applying different forces to the single-height stamp 301 when imprinting different regions of the optical device substrate 101, resist structures 106 having varying duty cycles are formed. However, as discussed above in relation to FIGS. 1A and 1B, lower duty cycle features have a thicker residual layer 120, and higher duty cycle features have a thinner residual layer 122. The difference in thicknesses of the residual layers 120, 122 may result in over-etching if the entirety of the resist structures 106 are etched in the same operation. The method 200 described herein allows a single-height stamp 301 or master to be used while preventing over-etching, critical dimension (CD) drifting, and blank film erosion.

The patterning of the first resist portion 111 of the first resist layer 105 results in the formation of the resist structures 106 having pitch 130 and critical dimension 140.

Additionally, the imprint process results in the formation of the first residual layer 120 having thickness 121. As discussed above, the thickness 121 of the first residual layer 120 corresponds to the duty cycle of the resist structures 106.

Figure 3B:
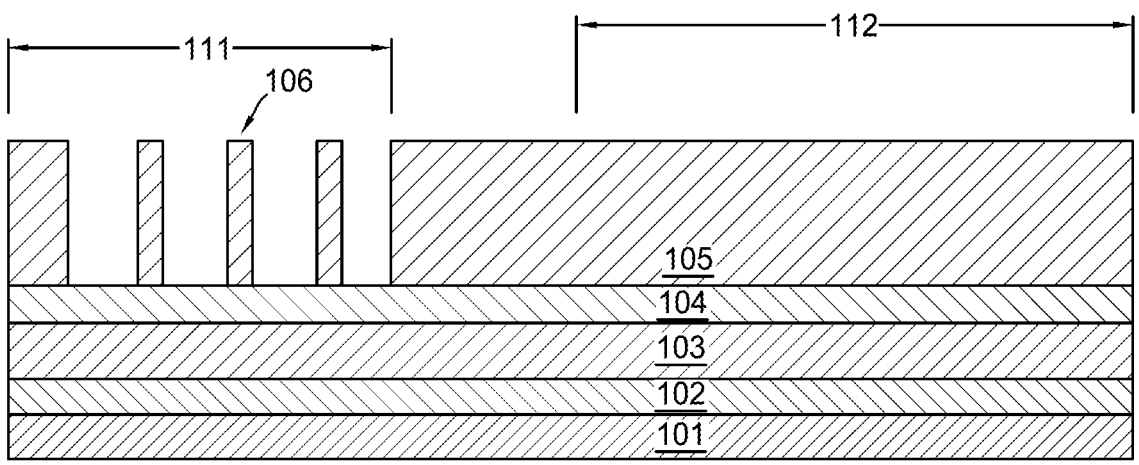

At operation 203, as shown in FIG. 3B, the first residual layer 120 of the first resist portion 111 of the resist layer 105 is etched. The first residual layer 120 of the first resist portion 111 is etched through surrounding the resist structures 106. The etch process may include one or more of ion beam etching, electron beam (e-beam) etching, or wet etching. In one embodiment, which can be combined with other embodiments described herein, the etching of the first residual layer 120 exposes the first wetting layer 104, which is then removed by one or more of dry ashing, dry etching, or wet etching. In another embodiment, which can be combined with other embodiments described herein, the etching of the first residual layer 120 exposes the hardmask 103.

Figure 3C:
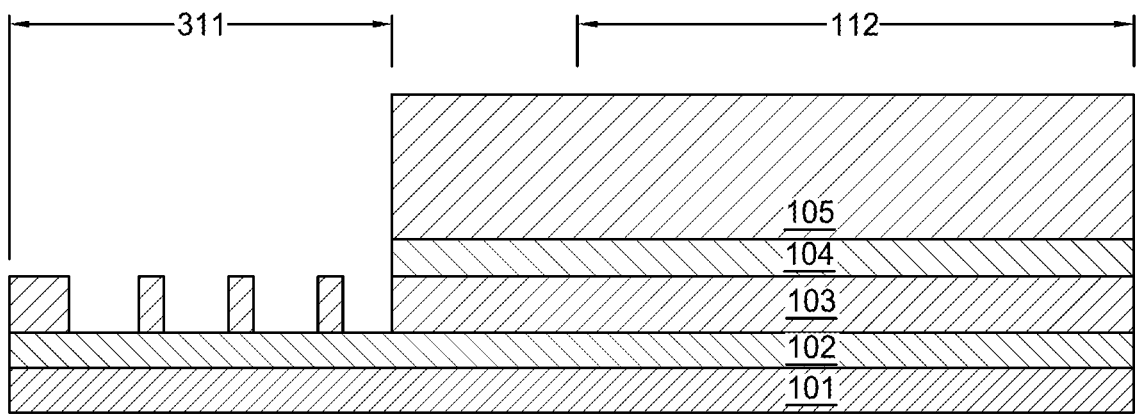

At operation 204, as shown in FIG. 3C, a first hardmask portion 311 of the hardmask 103 corresponding to the first resist portion 111 of the first resist layer 105 is etched by one or more of ion beam etching or electron beam (e-beam) etching. Using the resist structures 106 patterned in the first resist layer 105, the hardmask 103 is pattern etched through the openings in the patterned first resist layer 105. The patterned hardmask 103 corresponds to the pattern imprinted in the first resist layer 105 by the stamp 301.

Figure 3D:
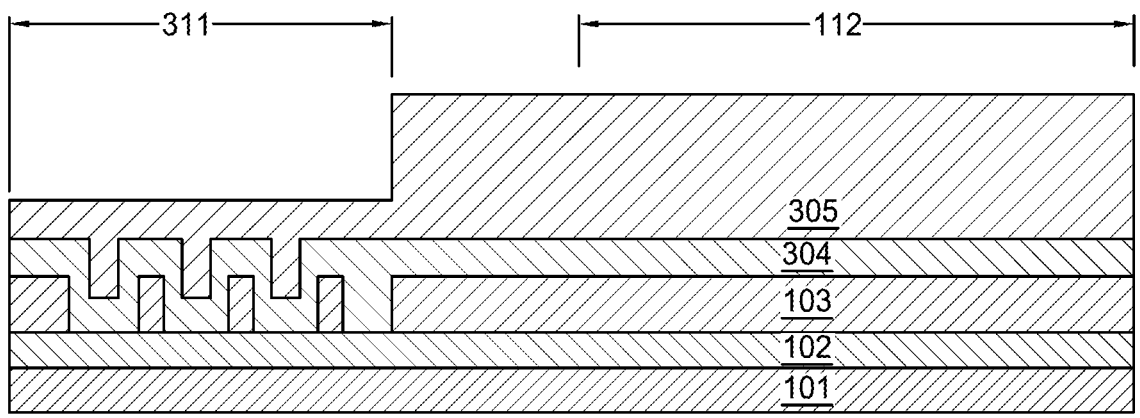

At operation 205, as shown in FIG. 3D, the first resist layer 105 is removed, and a second resist layer 305 is deposited on the hardmask 103. The first resist layer 105 is removed by one or more of dry ashing, dry etching, or wet etching. The second resist layer 305 covers the etched structures of the first hardmask portion 311 of the hardmask 103. In one embodiment, which can be combined with other embodiments described herein, a second wetting layer 304 is disposed on the hardmask 103 beneath the second resist layer 305.

Figure 3E:
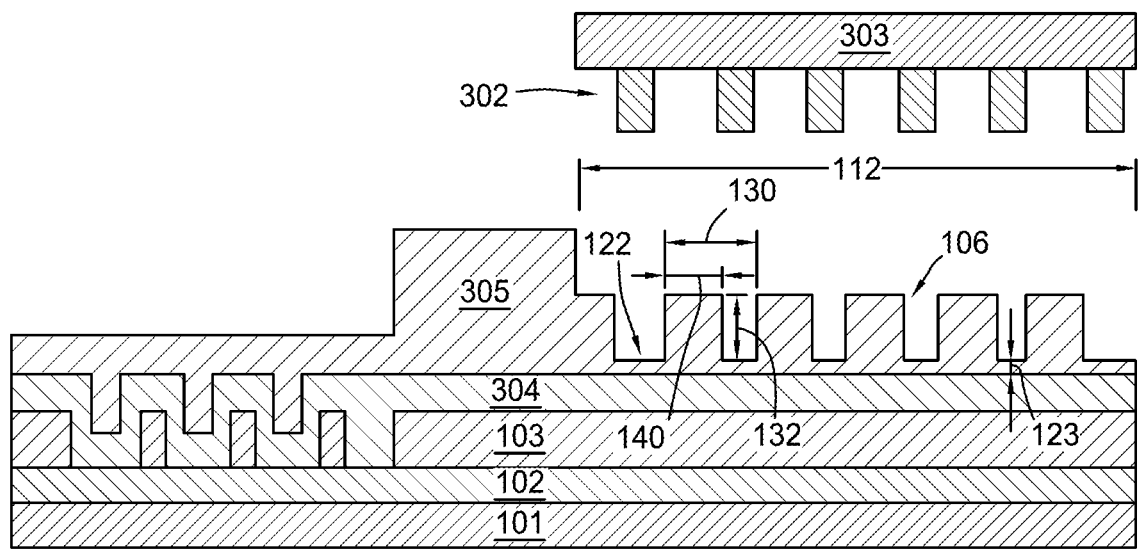

At operation 206, as shown in FIG. 3E, the second resist portion 112 of the second resist layer 305 is imprinted. In one embodiment, which can be combined with other embodiments described herein, the same stamp 301 is used at operation 206 to imprint the second resist portion 112 of the second resist layer 305 that is used at operation 202. In another embodiment, which can be combined with other embodiments described herein, a first stamp 301 is used at operation 206, and a second stamp 303 is used at operation 202 to imprint the second resist portion 112 of the second resist layer 305. The features 302 of the first stamp 301 and the second stamp 303 are a single-height.

Figure 3F:
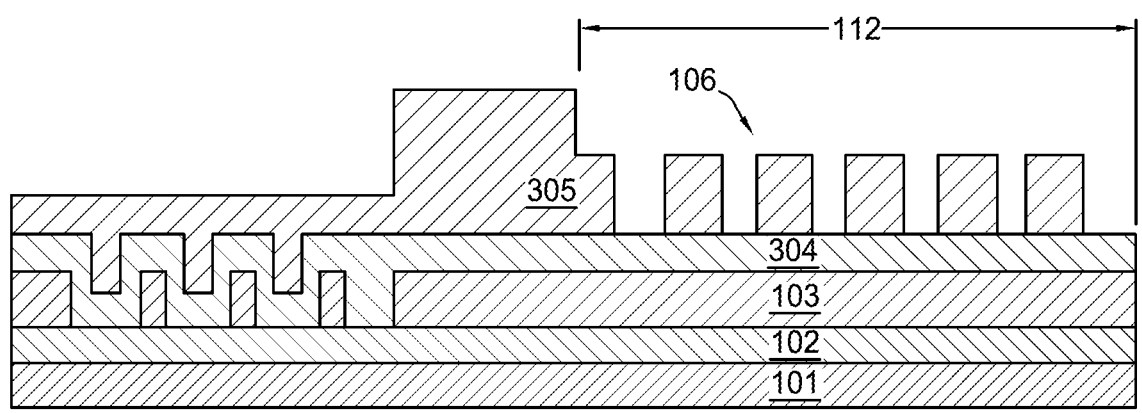

At operation 207, as shown in FIG. 3F, the second residual layer 122 corresponding to the second resist portion 112 of the second resist layer 305 is etched by one or more of ion beam etching or electron beam (e-beam) etching. The second residual layer 122 having thickness 123 is etched through surrounding the resist structures 106. In one embodiment, which can be combined with other embodiments described herein, the etching of the second residual layer 122 exposes the second wetting layer 304, which is then removed by one or more of dry ashing, dry etching, or wet etching. In another embodiment, which can be combined with other embodiments described herein, the etching of the second residual layer 122 exposes the hardmask 103.

Figure 3G:
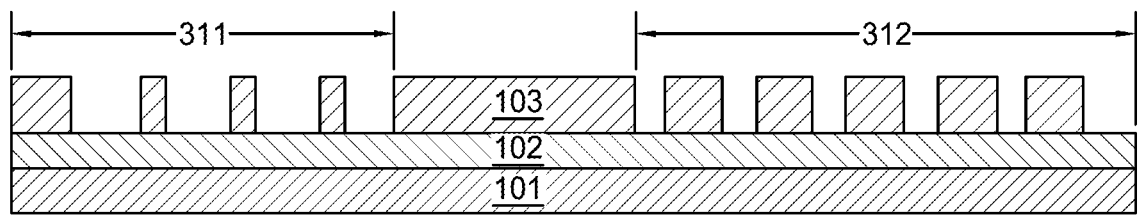
Figure 3H:
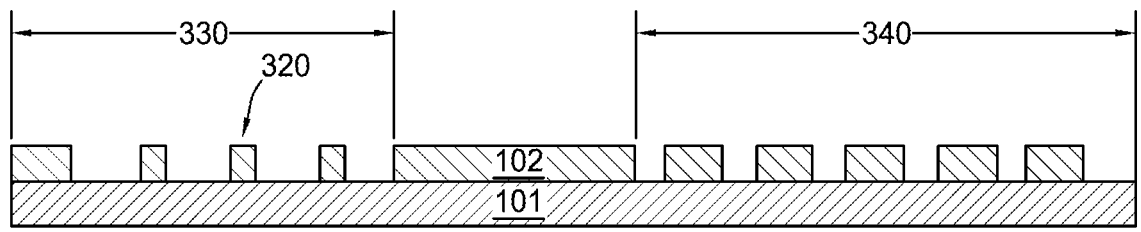

At operation 208, as shown in FIG. 3G, a second hardmask portion 312 of the hardmask 103 corresponding to the second resist portion 112 of the second resist layer 305 is etched by one or more of ion beam etching or electron beam (e-beam) etching. Using the resist structures 106 patterned in the second resist layer 305, the hardmask 103 is pattern etched through the openings in the patterned second resist layer 305. The patterned hardmask 103 corresponds to the pattern imprinted in the second resist layer 305 by the stamp 301.

After the hardmask 103 is etched in operation 208, the optical device substrate 101 undergoes further processing to form a plurality of optical device structures 320. In one embodiment, as shown in FIG. 3H, the device material 102 is etched through the hardmask 103 in order to form the plurality of optical device structures 320 on the optical device substrate 101 from the device material 102. In another embodiment, which can be combined with other embodiments described herein, the plurality of optical device structures 320 are formed by etching the optical device substrate 101. The first resist portion 111 of the first resist layer 105 corresponds to first optical device structures 330, and the second resist portion 112 of the second resist layer 305 corresponds to second optical device structures 340. The first optical device structures 330 have a first duty cycle, and the second optical device structures 340 have a second duty cycle different from the first duty cycle.

In one embodiment, which can be combined with other embodiments described herein, the stamp 301 is a negative pattern of the first optical device structures 330 and the second optical device structures 340. In another embodiment, which can be combined with other embodiments described herein, the first stamp 301 is a negative pattern of the first optical device structures 330, and the second stamp 303 is a negative pattern of the second optical device structures 340.

Figure 4:
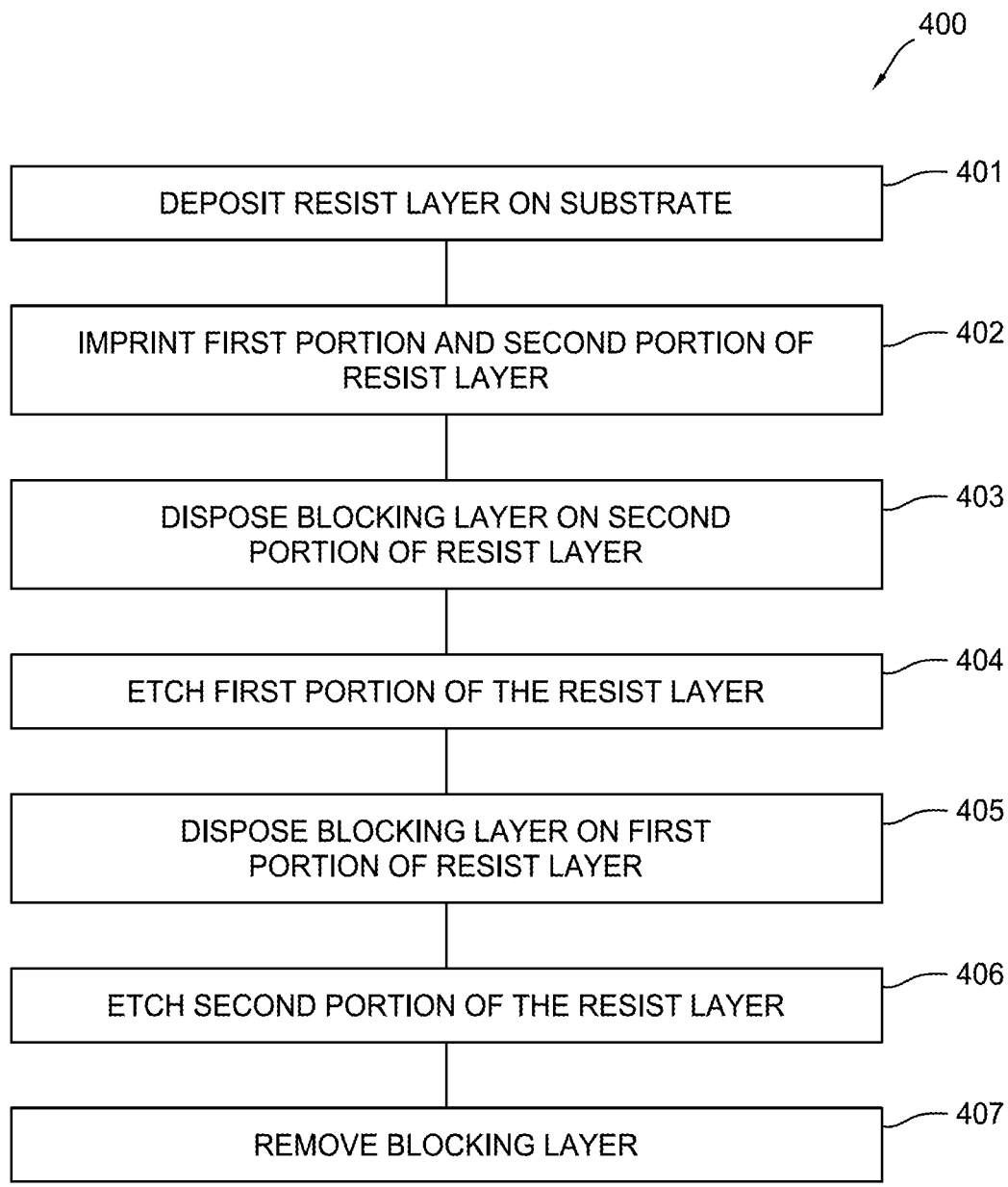
FIG. 4 is a method of patterning an optical device substrate according to one or more embodiments.

FIG. 4 is a method 400 of patterning an optical device substrate 101. FIGS. 5A-5E are schematic, cross-sectional views of a portion 100 of the optical device substrate 101.

At operation 401, the resist layer 105 is deposited on the optical device substrate 101 having the hardmask 103 disposed thereon. In one embodiment, which can be combined with other embodiments described herein, the first wetting layer 104 is disposed beneath the first resist layer 105. In one embodiment, which can be combined with other embodiments described herein, the device material 102 is disposed on the optical device substrate 101 beneath the hardmask 103.

Figure 5A:
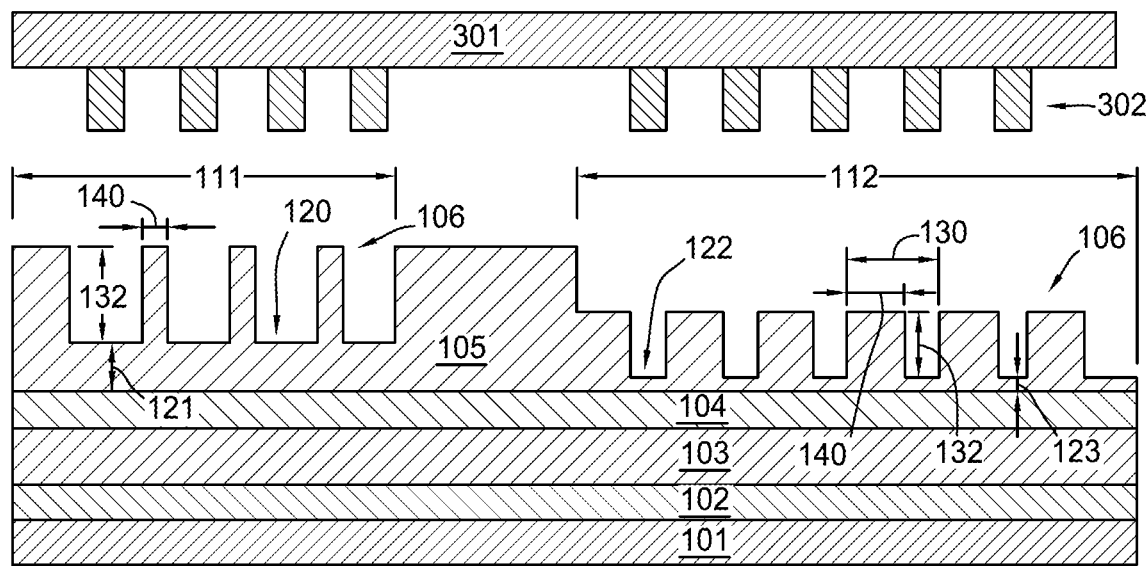
FIGS. 5A-5E are schematic, cross-sectional views of a portion of an optical device substrate according to one or more embodiments.

At operation 402, as shown in FIG. 5A, the first resist portion 111 and the second resist portion 112 of the first resist layer 105 is imprinted using the stamp 301. The stamp 301 is a single-height stamp, wherein the features of the stamp 301 are substantially equal in height. The patterning of the first resist portion 111 of the first resist layer 105 results in the formation of the resist structures 106 having pitch 130 and critical dimension 140.

Figure 5B:
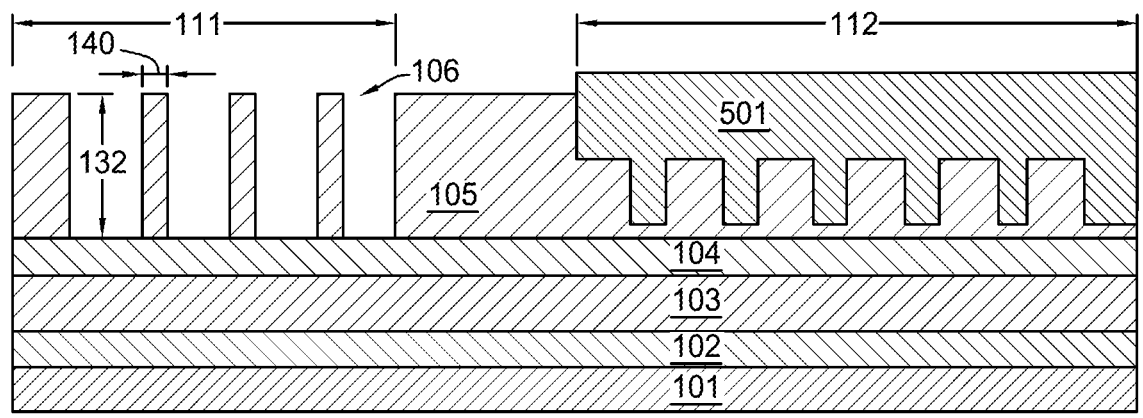

At operation 403, as shown in FIG. 5B, a blocking layer 501 is disposed on the second resist portion 112 of the first resist layer 105. The blocking layer 501 covers the second resist portion 112 while the first resist portion 111 of the first resist layer 105 is etched in operation 404. The blocking layer 501 may include at least one photoresist. In one embodiment, which can be combined with other embodiments described herein, the photoresist may include a backside antireflective coating. In another embodiment, which can be combined with other embodiments described herein, the photoresist may include silicon actinium (SiAc) and an optical planarization layer. The blocking layer 501 allows the use of the single nanoimprint step at operation 402 using a single stamp.

Figure 5C:
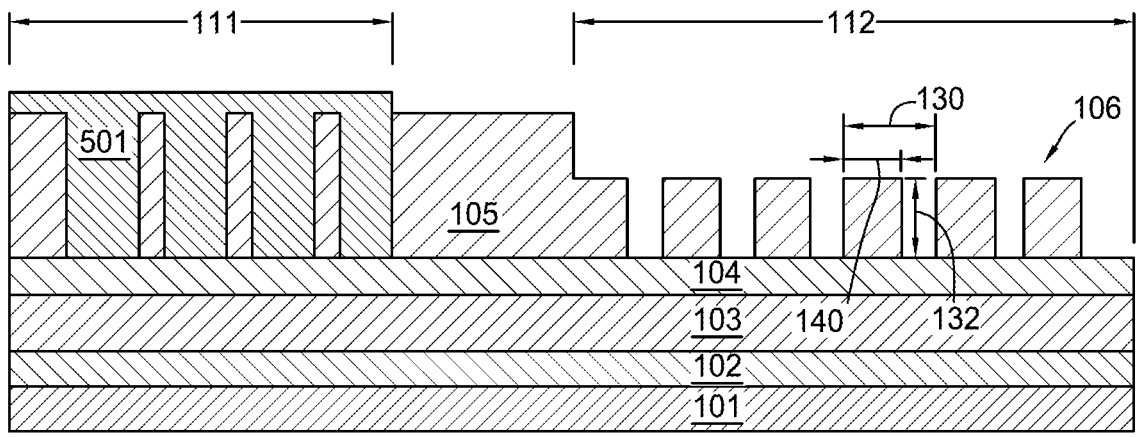

At operation 405, as shown in FIG. 5C, the blocking layer 501 is disposed on the first resist portion 111 of the first resist layer 105. The blocking layer 501 covers the first resist portion 111 while the second resist portion 112 of the first resist layer 105 is etched in operation 406.

Figure 5D:
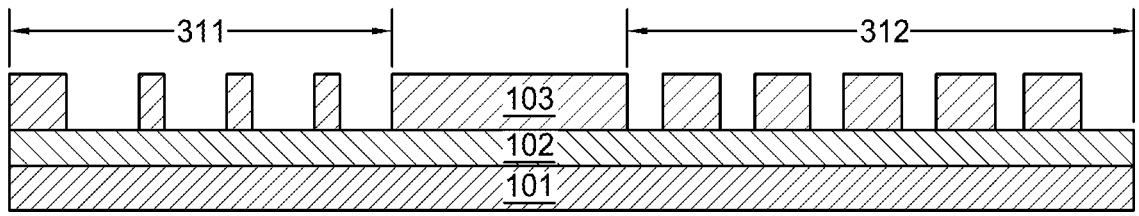
Figure 5E:
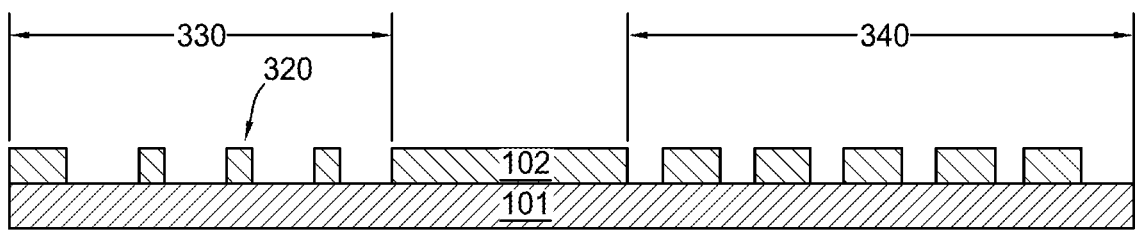

After the first resist layer 105 is etched, the blocking layer 501 is removed at operation 407 so that the optical device substrate 101 may be further processed. As shown in FIG. 5D, the first hardmask portion 311 and the second hardmask portion 312 of the hardmask 103 are etched by one or more of ion beam etching or electron beam (e-beam) etching. Using the resist structures 106 patterned in the first resist layer 105, the hardmask 103 is pattern etched through the openings in the patterned first resist layer 105. The patterned hardmask 103 corresponds to the pattern imprinted in the resist layer 105 by the stamp 301.

The optical device substrate 101 undergoes further processing to form a plurality of optical device structures 320 after the hardmask 103 is etched. In one embodiment, as shown in FIG. 5D, the device material 102 is etched through the hardmask 103 in order to form the plurality of optical device structures 320 on the optical device substrate 101 from the device material 102. In another embodiment, which can be combined with other embodiments described herein, the plurality of optical device structures 320 are formed by etching the optical device substrate 101. The first resist portion 111 of the first resist layer 105 corresponds to first optical device structures 330, and the second resist portion 112 of the first resist layer 105 corresponds to second optical device structures 340. The first optical device structures 330 have a first duty cycle, and the second optical device structures 340 have a second duty cycle different from the first duty cycle. The single-height stamp 301 is a negative pattern of the plurality of optical device structures 320.

In summation, according to methods of forming optical devices using nanoimprint lithography and etch processes described herein, overall processing uniformity is improved. By separately etching regions with different duty cycles, over-etching due to varying thicknesses of the residual layers is reduced, thereby improving the resolution of resist structures and, subsequently, optical device structures. Additionally, processing efficiency is improved through the use of a single-height stamp.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
depositing a first resist layer on a substrate, the substrate having a hardmask disposed over a device material, the device material is disposed under an entire area of the hardmask;
imprinting a first resist portion of the first resist layer with a first single-height stamp having first duty cycle to corresponding to a first duty cycle of first optical device structures of an optical device to be formed;
etching the first resist portion of the first resist layer;
etching a first hardmask portion of the hardmask corresponding to the first resist portion of the first resist layer;
removing the first resist layer and depositing a second resist layer;
imprinting a second resist portion of the second resist layer with a second single-height stamp having a second duty cycle to corresponding to a second duty cycle of second optical device structures of the optical device to be formed;
etching the second resist portion of the second resist layer;
etching a second hardmask portion of the hardmask corresponding to the second resist portion of the second resist layer; and
etching the device material to form an optical device with a first portion of having the first optical device structures with the first duty cycle, the second optical device structures with the second duty cycle different that the first duty cycle, and an intermediate portion between the first portion and the second portion.

2. The method of claim 1, wherein the first single-height stamp is a negative pattern of the first optical device structures.

3. The method of claim 1, wherein the second single-height stamp is a negative pattern of the second optical device structures.

4. The method of claim 1, wherein depositing the first resist layer comprises a spin-on deposition process.

5. A method, comprising:
depositing a first resist layer on a substrate, the first resist layer having a first resist portion having first resist structures with a first residual layer therebetween and a second resist portion having second resist structures with a second residual layer therebetween, wherein a first thickness of the first residual layer is greater than a second thickness of the second residual layer;
imprinting the first resist layer with a single-height stamp;
disposing a blocking layer on the second resist portion of the first resist layer;
etching the first resist portion of the first resist layer;
disposing the blocking layer on the first resist portion of the first resist layer;
removing the blocking layer; and
etching the second resist portion of the first resist layer.

6. The method of claim 5, further comprising a device material disposed between the substrate and the first resist layer, and a hardmask disposed on the device material, the device material is disposed under an entire area of the hardmask.

7. The method of claim 6, wherein a wetting layer is disposed on the hardmask.

8. The method of claim 6, further comprising etching the hardmask and then etching the device material to form a plurality of optical device structures on the substrate, wherein the first resist portion of the first resist layer corresponds to first optical device structures and the second resist portion of the first resist layer corresponds to second optical device structures.

9. The method of claim 8, wherein the single-height stamp is a negative pattern of the plurality of optical device structures formed on the substrate.

10. The method of claim 5, further comprising etching the hardmask and then etching the substrate to form a plurality of optical device structures, wherein the first resist portion of the first resist layer corresponds to first optical device structures and the second resist portion of the first resist layer corresponds to second optical device structures.

11. The method of claim 10, wherein the single-height stamp is a negative pattern of the plurality of optical device structures.

12. The method of claim 5, wherein depositing the first resist layer comprises a spin-on deposition process.

13. The method of claim 5, wherein the blocking layer comprises at least one photoresist.

14. A method, comprising:
depositing a first resist layer on a substrate through a spin-on deposition process, the substrate having a hardmask and a device material disposed thereon over a device material, the device material is disposed under an entire area of the hardmask;
imprinting a first resist portion of the first resist layer with a first single-height stamp having first duty cycle to corresponding to a first duty cycle of first optical device structures of an optical device to be formed, the first resist layer having a first residual layer thickness;
etching the first resist portion of the first resist layer;
etching a first hardmask portion of the hardmask corresponding to the first resist portion of the first resist layer;
removing the first resist layer and depositing a second resist layer;
imprinting a second resist portion of the second resist layer with a second single-height stamp having first duty cycle to corresponding to a second duty cycle of second optical device structures of the optical device to be formed, the second resist layer having a second residual layer thickness less than the first residual layer thickness;
etching the second resist portion of the second resist layer;
etching a second hardmask portion of the hardmask corresponding to the second resist portion of the second resist layer; and
etching the device material to form an optical device with a first portion of having the first optical device structures with the first duty cycle and the second optical device structures with the second duty cycle different that the first duty cycle.

* * * * *